US012796021B2

(12) United States Patent
Yen et al.

(10) Patent No.: US 12,796,021 B2
(45) Date of Patent: Nov. 10, 2026

(54) FILM DEPOSITION AND TREATMENT PROCESS FOR SEMICONDUCTOR DEVICES

(71) Applicant: Taiwan Semiconductor Manufacturing Company, Ltd., Hsinchu (TW)

(72) Inventors: Hung-Yu Yen, Taipei (TW); Ko-Feng Chen, Hsinchu City (TW); Keng-Chu Lin, Ping-Tung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 640 days.

(21) Appl. No.: 17/654,886

(22) Filed: Mar. 15, 2022

(65) Prior Publication Data

US 2023/0047641 A1 Feb. 16, 2023

Related U.S. Application Data

(60) Provisional application No. 63/232,680, filed on Aug. 13, 2021.

(51) Int. Cl.

| | |
|---|---|
| ***H10D 62/10*** | (2025.01) |
| ***H10D 30/01*** | (2025.01) |
| ***H10D 30/67*** | (2025.01) |
| *H10P 14/60* | (2026.01) |
| *H10P 14/694* | (2026.01) |
| *H10P 50/64* | (2026.01) |

(52) U.S. Cl.

CPC ......... *H10D 62/116* (2025.01); *H10D 30/014* (2025.01); *H10D 30/031* (2025.01); *H10D 30/6713* (2025.01); *H10D 30/6729* (2025.01); *H10D 30/6735* (2025.01); *H10D 30/6757* (2025.01); *H10D 62/121* (2025.01); *H10P 14/6316* (2026.01); *H10P 14/6319* (2026.01); *H10P 14/69433* (2026.01); *H10P 50/642* (2026.01)

(58) Field of Classification Search

CPC ......... H01L 29/66439; H01L 29/66742; H01L 29/78618; H01L 21/0217; H01L 21/02247; H01L 21/02252; H01L 21/30604; H01L 29/0673; H01L 29/41733; H01L 29/42392; H01L 29/78696

See application file for complete search history.

(56) References Cited

U.S. PATENT DOCUMENTS

| | | | | |
|---|---|---|---|---|
| 9,947,804 | B1 * | 4/2018 | Frougier | H10D 30/6743 |
| 2016/0315191 | A1 * | 10/2016 | Tsai | H01L 29/7834 |
| 2018/0108660 | A1 * | 4/2018 | Pranatharthiharan | H10D 89/10 |
| 2020/0220018 | A1 * | 7/2020 | Jang | B82Y 10/00 |
| 2020/0373402 | A1 * | 11/2020 | Yang | H10D 62/113 |
| 2021/0210349 | A1 * | 7/2021 | Xie | H01L 21/76224 |

(Continued)

*Primary Examiner* — Jacob Y Choi
*Assistant Examiner* — Neil R Prasad
(74) *Attorney, Agent, or Firm* — Sterne, Kessler, Goldstein & Fox P.L.L.C.

(57) ABSTRACT

The present disclosure describes a semiconductor device that includes nanostructures on a substrate and a source/drain region in contact with the nanostructures. The source/drain region includes (i) a first epitaxial structure embedded in the substrate; (ii) a nitride layer on the first epitaxial structure; and a second epitaxial structure on the first epitaxial structure. The semiconductor device also includes a gate structure formed on the nanostructures.

20 Claims, 15 Drawing Sheets

(56) References Cited

U.S. PATENT DOCUMENTS

| | | | | |
|---|---|---|---|---|
| 2021/0217848 | A1* | 7/2021 | Kim | H10D 30/014 |
| 2022/0037193 | A1* | 2/2022 | Yu | H01L 29/7848 |
| 2023/0154748 | A1* | 5/2023 | Niitani | C23C 28/40<br>257/616 |

* cited by examiner

FILM DEPOSITION AND TREATMENT PROCESS FOR SEMICONDUCTOR DEVICES

CROSS-REFERENCE TO RELATED APPLICATIONS

The present application claims the benefit of U.S. Provisional Patent Appl. No. 63/232,680, titled "Film Deposition and Treatment Process for Semiconductor Devices" and filed on Aug. 13, 2021, which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices and three-dimensional transistors, such as gate-all-around (GAA) field effect transistors and fin field effect transistors (finFETs), are introduced.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
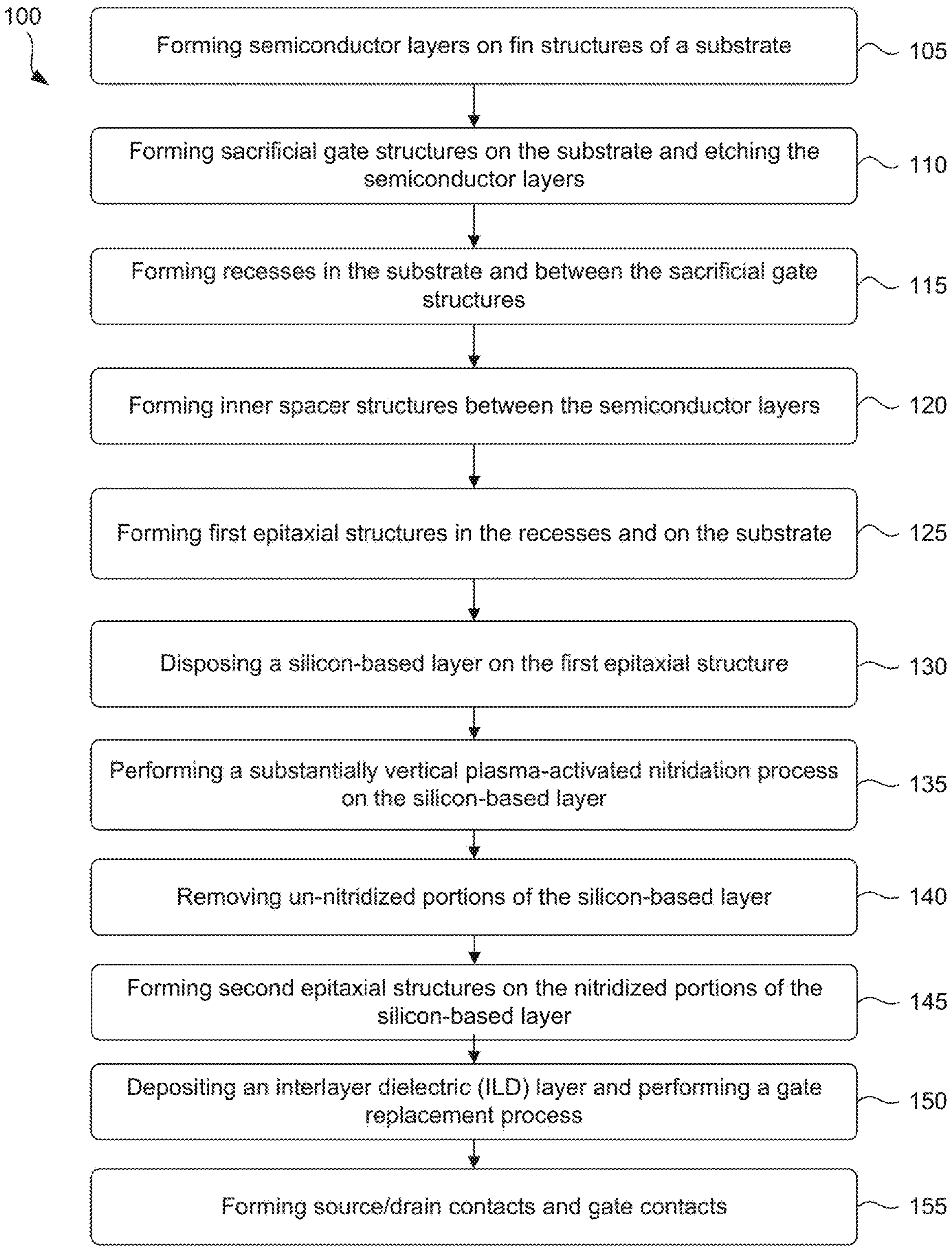
FIG. 1 is a flow diagram of a method for fabricating multi-layer epitaxial source/drain structures in semiconductor devices using film deposition and treatment processes, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate, such as a semiconductor wafer, or (ii) built with vertical structures.

The term "FinFET" refers to a FET formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

The terms "vertical direction" and "horizontal direction" respectively refer to z-direction and x-direction as illustrated in the figures herein.

The present disclosure provides example field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

Epitaxially-grown materials are implemented in semiconductor devices to increase device speed and reduce device power consumption. For example, source/drain terminals of transistor devices formed of doped epitaxial materials can provide benefits, such as enhanced carrier mobility and improved device performance. Epitaxial source/drain terminals can be formed by epitaxially disposing crystalline material on a substrate. As the semiconductor industry continues to scale down the dimensions of semiconductor devices, circuit complexity has increased at all device levels. For example, beyond the 5 nm technology node or the 3 nm technology node, increased source/drain tunneling can increase leakage current. Short channel effects can also be one of the reasons for device failure. Semiconductor devices implementing nanostructures, such as nanowires, are potential candidates to overcome the short channel effects. Among them, GAA transistor devices can reduce short channel effects and enhance carrier mobility, which in turn improve device performance. However, it has become increasingly challenging to dispose epitaxial material in high aspect ratio openings of GAA devices for forming source/drain terminals, without forming defects in the deposited material. Defects, such as voids and clustering formed in the source/drain structures, can impact device performance and reduce device yield.

Various embodiments in the present disclosure describe methods for forming epitaxial source/drain structures. For example, a multi-operation epitaxial source/drain formation process can be used in forming source/drain structures for GAAFETs. For example, a silicon-based film can be deposited on a first epitaxial structure followed by a plasma-activated nitridation treatment process on the silicon-based film. Portions of the silicon-based film that are not nitridized can be removed. A second epitaxial structure can be formed on the treated silicon-based film. The treated silicon-based film can be a nitride layer that facilitates epitaxial growth of the second epitaxial structure. The first epitaxial structure, the treated silicon-based film, and the second epitaxial structure can form a multi-layer epitaxial source/drain structure. In some embodiments, the first and second epitaxial structures can be formed using different materials.

The nitridation process described in the present disclosure can include a high-bias potential in-situ or ex-situ plasma-activated nitridation process without plasma-induced damage to underlying structures. Multi-operation epitaxial source/drain structures described herein provide various benefits that can improve device performance, reliability, and yield. Benefits can include, but are not limited to, reduced short channel effects, reduced voids, and reduced defects, among other things. The embodiments described herein use GAAFETs as examples and can be applied to other semiconductor structures, such as finFETs and planar FETs. In addition, embodiments described herein can be used in various technology nodes, such as 14 nm, 7 nm, 5 nm, 3 nm, 2 nm, and other technology nodes.

FIG. 1 is a flow diagram of a method 100 for fabricating a semiconductor device incorporating multi-layer epitaxial source/drain structures, according to some embodiments. For illustrative purposes, the operations illustrated in FIG. 1 will be described with reference to the example fabrication process of fabricating semiconductor device 200 as illustrated in FIGS. 2A-2C, 3A, 3B, and 4-12. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Figures 2A, 2B, 2C:
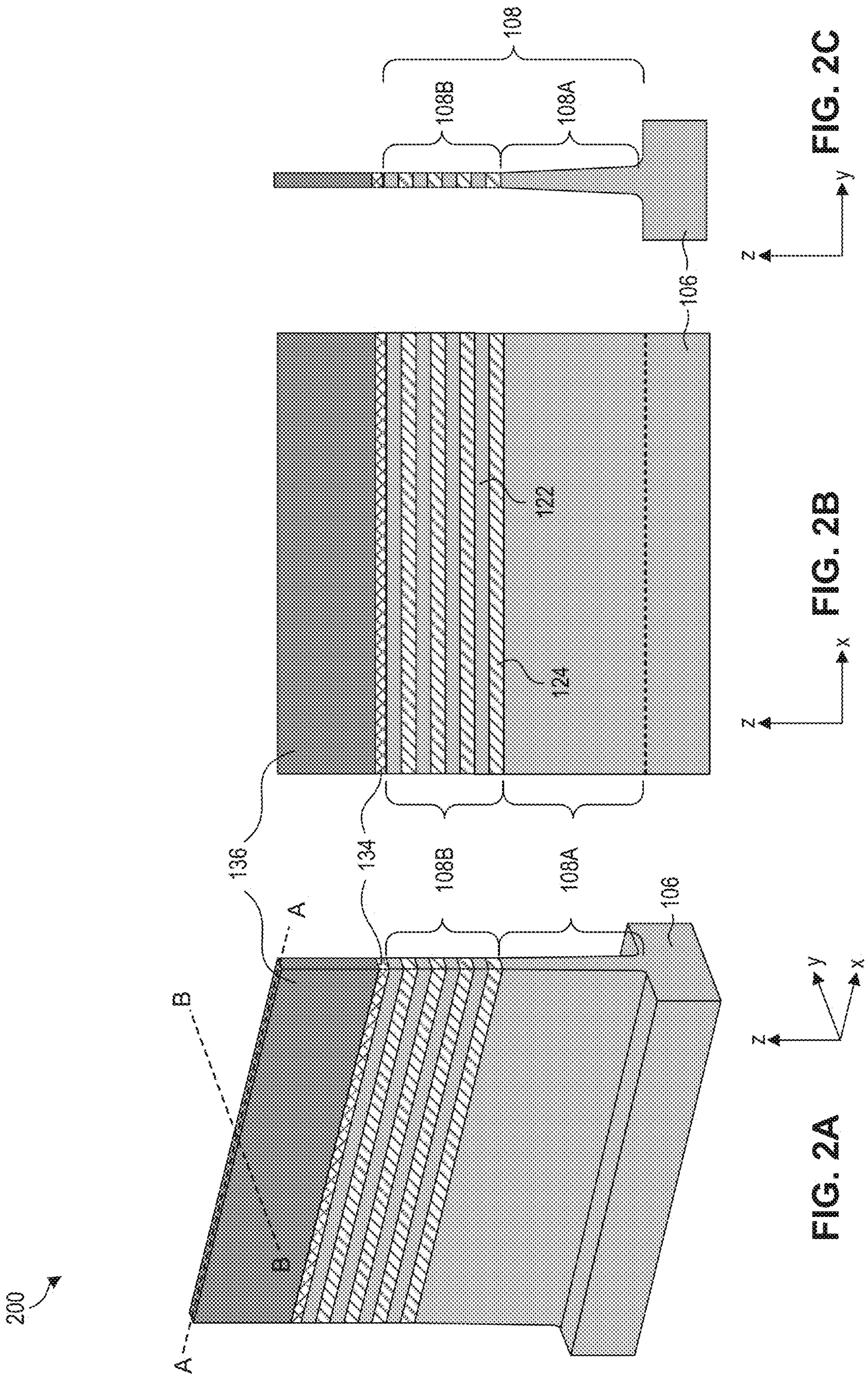
FIGS. 2A-2C, 3A, 3B, and 4-12 illustrate various cross-sectional views of semiconductor devices at various stages of their fabrication process, in accordance with some embodiments.

Referring to FIG. 1, in operation 105, semiconductor layers are formed on fin structures of a substrate, according to some embodiments. For example, fin structure 108 with fin base portion 108A and fin top portion 108B can be formed on substrate 106 as described with reference to semiconductor device 200 illustrated in FIGS. 2A-2C. FIG. 2B is a cross-sectional view of the structure in FIG. 2A as viewed from the A-A line. FIG. 2C is a cross-sectional view of the structure in FIG. 2A as viewed from the B-B line. The formation of fin structure 108 can include the formation of fin base portion 108A and fin top portion 108B on substrate 106 as shown in FIGS. 2A-2C.

Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Fin structure 108 extends along an x-axis. Fin structure 108 can be a part of a substrate and include a fin base portion 108A and a fin top portion 108B disposed on fin base portion 108A. In some embodiments, fin base portion 108A can include material similar to substrate 106. Fin base portion 108A can be formed from a photolithographic patterning and an etching of substrate 106. In some embodiments, fin top portion 108B can include a stack of semiconductor layers. Each semiconductor layer can be subsequently processed to form a channel region underlying subsequently-formed gate structures of the finFETs. Fin top portion 108B can include a first group of semiconductor layers 122 and a second group of semiconductor layers 124 stacked in an alternating configuration. Each of semiconductor layer 122 and 124 can be epitaxially grown on its underlying layer and can include semiconductor materials different from each other. In some embodiments, semiconductor layers 122 and 124 can include semiconductor materials similar to or different from substrate 106. In some embodiments, semiconductor layers 122 and 124 can include semiconductor materials with oxidation rates and/or etch selectivity different from each other. In some embodiments, each of semiconductor layers 122 can be formed of silicon and each of semiconductor layers 124 can be formed of silicon germanium. In some embodiments, semiconductor layers 122 can be formed of silicon germanium and semiconductor layers 124 can be formed of silicon. Semiconductor layers 122 and/or semiconductor layers 124 can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane ($B_2H_6$), boron trifluoride ($BF_3$), and any other p-type doping precursor, can be used. For n-type in-situ doping, n-type doping precursors, such as phosphine ($PH_3$), arsine ($AsH_3$), and any other n-type doping precursor, can be used. Though four layers for each of semiconductor layers 122 and semiconductor layers 124 are shown in FIGS. 2A-2C, semiconductor device 200 can have any suitable number of semiconductor layers 122 and semiconductor layers 124.

Forming fin base portion 108A and fin top portion 108B can include forming a stack of materials for semiconductor layers 122 and 124 on substrate 106 and etching a portion of substrate 106 and the stack of materials through patterned hard mask layers 134 and 136 formed on the stack of materials. In some embodiments, hard mask layer 134 can be a thin film including silicon oxide formed using, for example, a thermal oxidation process. In some embodiments, hard mask layer 136 can be formed of silicon nitride using, for example, low-pressure chemical vapor deposition (LPCVD) or plasma-enhanced chemical vapor deposition (PECVD). The etching of the stack of materials can include a dry etch, a wet etch process, or a combination thereof. Hard mask layers 134 and 136 can be removed after fin structures 108 are formed.

Figure 3A:
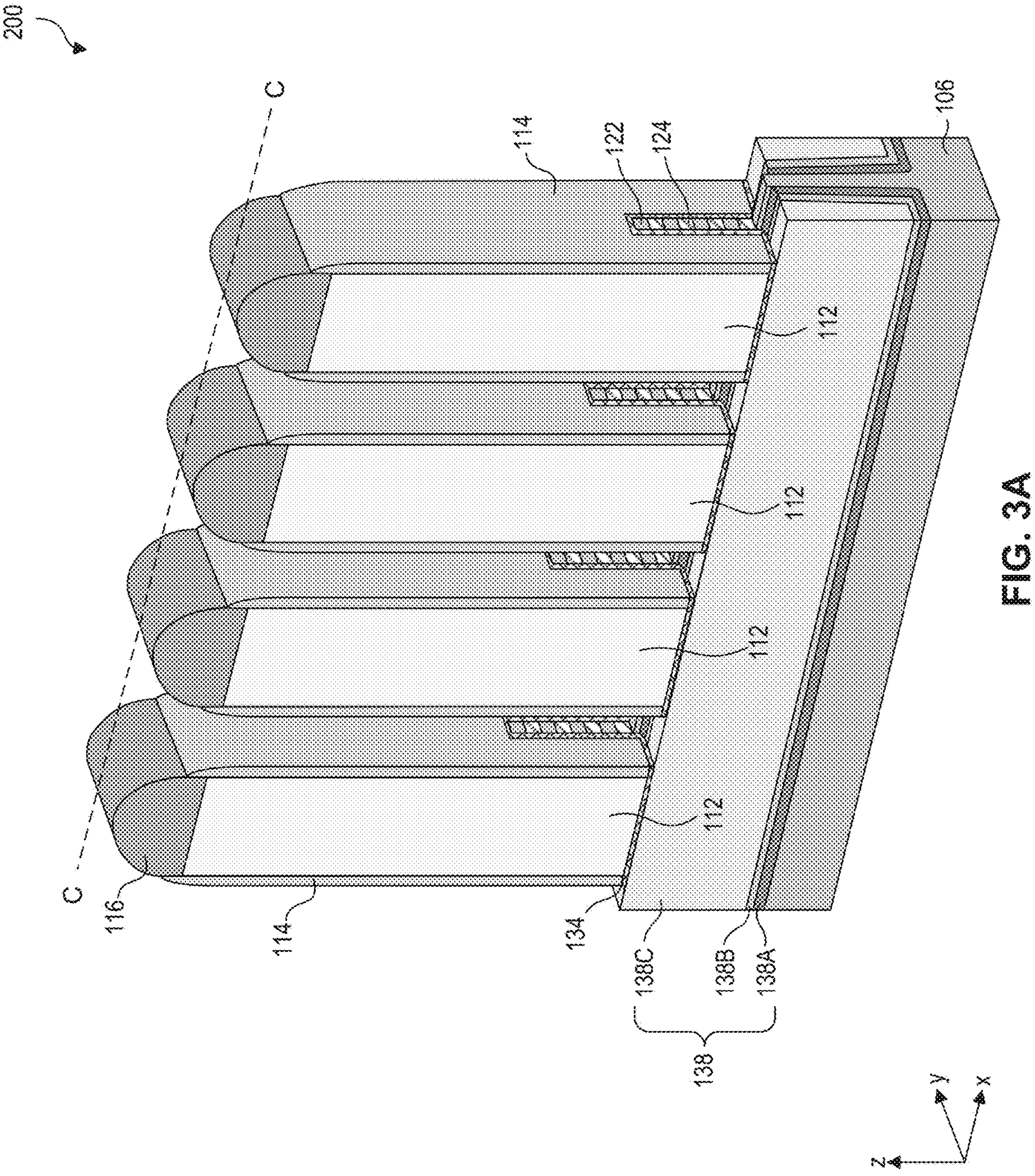
Figure 3B:
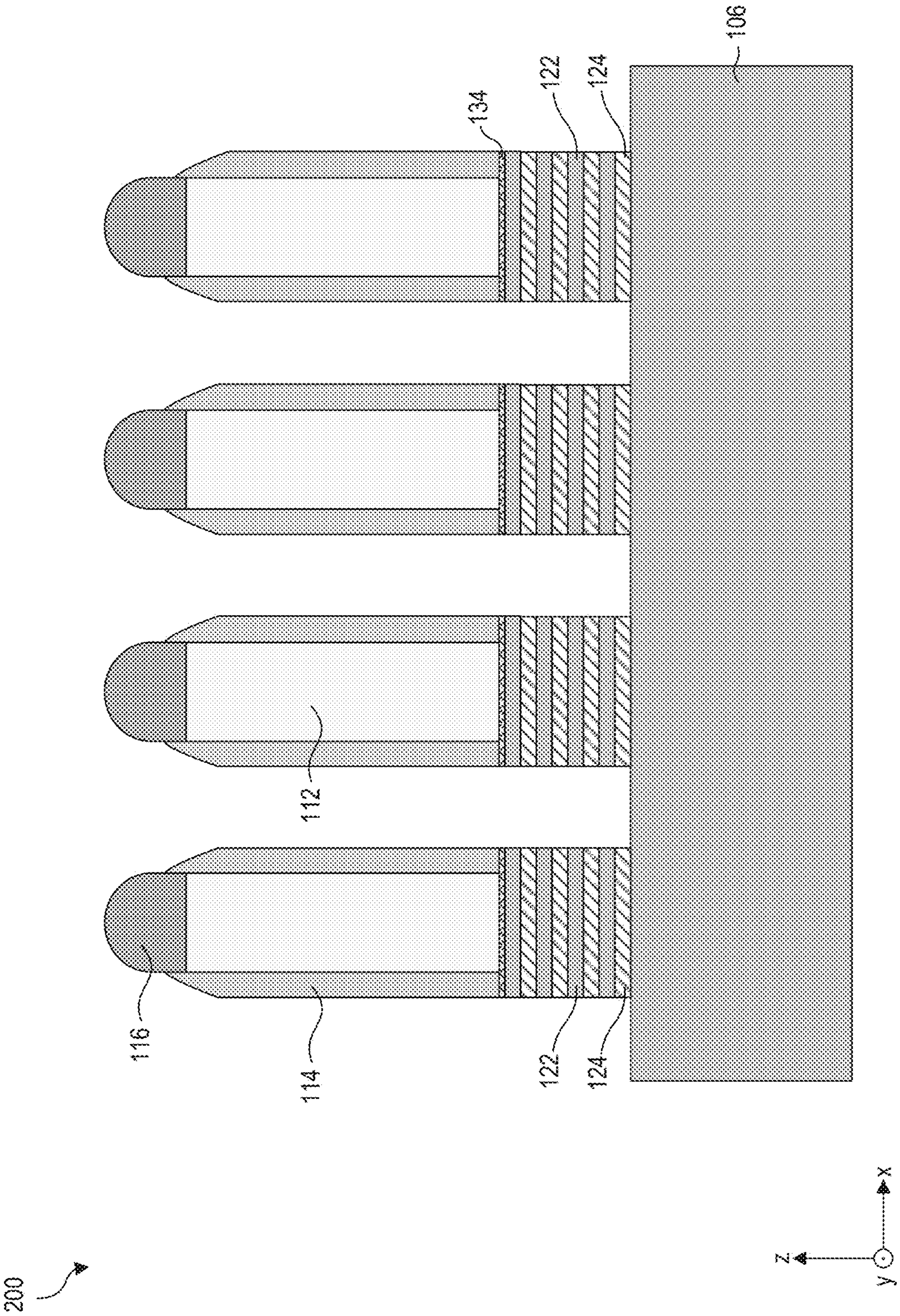

Referring to FIG. 1, in operation 110, sacrificial gate structures are formed on the substrate and the semiconductor layers are etched, according to some embodiments. Referring to FIGS. 3A and 3B, STI regions 138 with first and second protective liners 138A-138B and insulating layer 138C can be formed on substrate 106. FIG. 3B is a cross-sectional view of semiconductor device 200 in FIG. 3A as viewed from the C-C line. In some embodiments, hard mask layer 136 remains on the top surfaces of hard mask layer 134 after the formation of STI regions 138. In some embodiments, hard mask layer 136 is removed prior to the formation of STI regions 138. Forming STI regions 138 can include (i) depositing a layer of nitride material (not shown) for first protective liners 138A on the structure of FIG. 2A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 3A. The layers of nitride and oxide materials can be deposited using a suitable process for depositing oxide and nitride materials, such as atomic layer deposition (ALD), chemical vapor deposition (CVD), physical vapor deposition (PVD), and the like. These layers of oxide and nitride materials can prevent oxidation of the sidewalls of fin top portion 108B during the deposition and annealing of the insulating material for insulating layer 138C. In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane ($SiH_4$) and oxygen ($O_2$) as reacting precursors. In some embodiments, the layer of insulating material can be formed using a sub-atmospheric CVD (SACVD) process or high aspect-ratio process (HARP), where process gases can include tetraethoxysilane (TEOS) and/or ozone ($O_3$).

Polysilicon gate structures 112 are formed on STI regions 138, as shown in FIGS. 3A and 3B. Polysilicon gate structures 112 are sacrificial gate structures and can be replaced in a gate replacement process to form metal gate structures. In some embodiments, the formation of polysilicon gate structures 112 can include blanket depositing a layer of polysilicon material and etching the layer of polysilicon material through a patterned hard mask layer 116 formed on the layer of polysilicon material. In some embodiments, the layer of polysilicon material can be undoped and hard mask layer 116 can include an oxide layer and/or a nitride layer. The oxide layer can be formed using a thermal oxidation process and the nitride layer can be formed by LPCVD or PECVD. Hard mask layer 116 can protect polysilicon gate structures 112 from subsequent processing operations (e.g., during formation of spacers 114, source/drain regions, and/or ILD layers). The blanket deposition of the layer of polysilicon material can include CVD, PVD, ALD, or any other suitable deposition process. In some embodiments, etching of the deposited layer of polysilicon material can include a dry etch, a wet etch, or a combination thereof. Spacers 114 can be formed on sidewalls of polysilicon gate structures 112. Forming spacers 114 can include blanket depositing a layer of an insulating material (e.g., an oxide, a nitride, and/or silicon carbon oxynitride material) followed by photolithography and an etching process (e.g., reactive ion etching or any other suitable dry etching process using a chlorine- or fluorine-based etchant).

Fin top portions can be etched after polysilicon gate structures 112 are formed. The etch process can remove portions of semiconductor layers 122 and semiconductor layers 124 that are exposed between adjacent polysilicon gate structures 112. The etch process can include a wet etch process using, for example, diluted HF. In some embodiments, one or more etching process can be used. For example, the etching process can include an etching process for removing silicon material and another etching process for removing silicon germanium material. During the etching process, polysilicon gate structures 112 can be protected from being etched by spacers 114 and hard mask layer 116.

Figure 4:
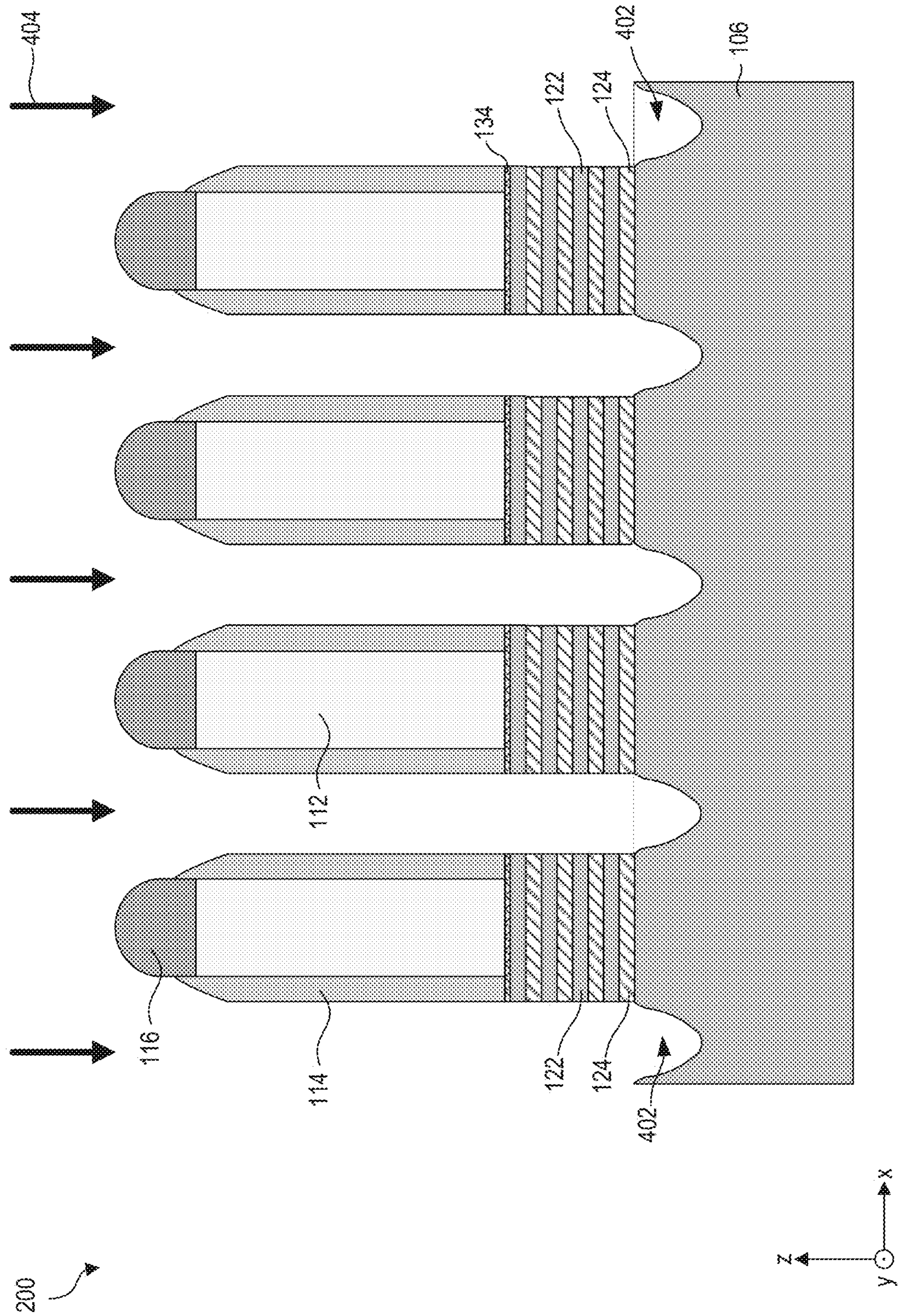

Referring to FIG. 1, in operation 115, recesses can be formed in the substrate between polysilicon gate structures, according to some embodiments. Referring to FIG. 4, recesses 402 (e.g., grooves) can be formed in substrate 106 and between adjacent poly gate structures 112. Recesses 402 can be formed using an anisotropic etching process 404 with an etching rate in the vertical direction (e.g., along the z-axis) substantially greater than an etching rate in the horizontal direction (e.g., along the x-axis). For example, a plasma etching process using fluorine and/or chlorine etchants can be used. In some embodiments, the plasma etching process can use sulfur hexafluoride, carbon tetrafluoride, fluoroform, boron trichloride, hydrogen bromide, any suitable etchants, or combinations thereof. In some embodiments, a voltage bias can be applied to substrate 106 to increase the etching rate in the vertical direction. In some embodiments, recesses 402 can be formed during operation 110 of etching semiconductor layers 122 and semiconductor layers 124. For example, etching semiconductor layers 122 and 124 can include alternating cycles of etching processes, and etching process 404 can use similar plasma species as the plasma etching process for etching semiconductor layers 122. In some embodiments, recesses 402 can have a concave shape with sloped sidewalls (e.g., a substantially U-shaped structure) which can reduce voids in subsequently-formed source/drain regions by eliminating sharp corners. Although recesses 402 having U-shaped cross-sections are shown in FIG. 4, recesses 402 can have any other suitable shapes not illustrated in FIG. 4 for simplicity. For example, recesses 402 can have a substantially U-shaped cross-section area. In some embodiments, recesses 402 can have substantially vertical sidewalls (e.g., along the z-axis).

Figure 5:
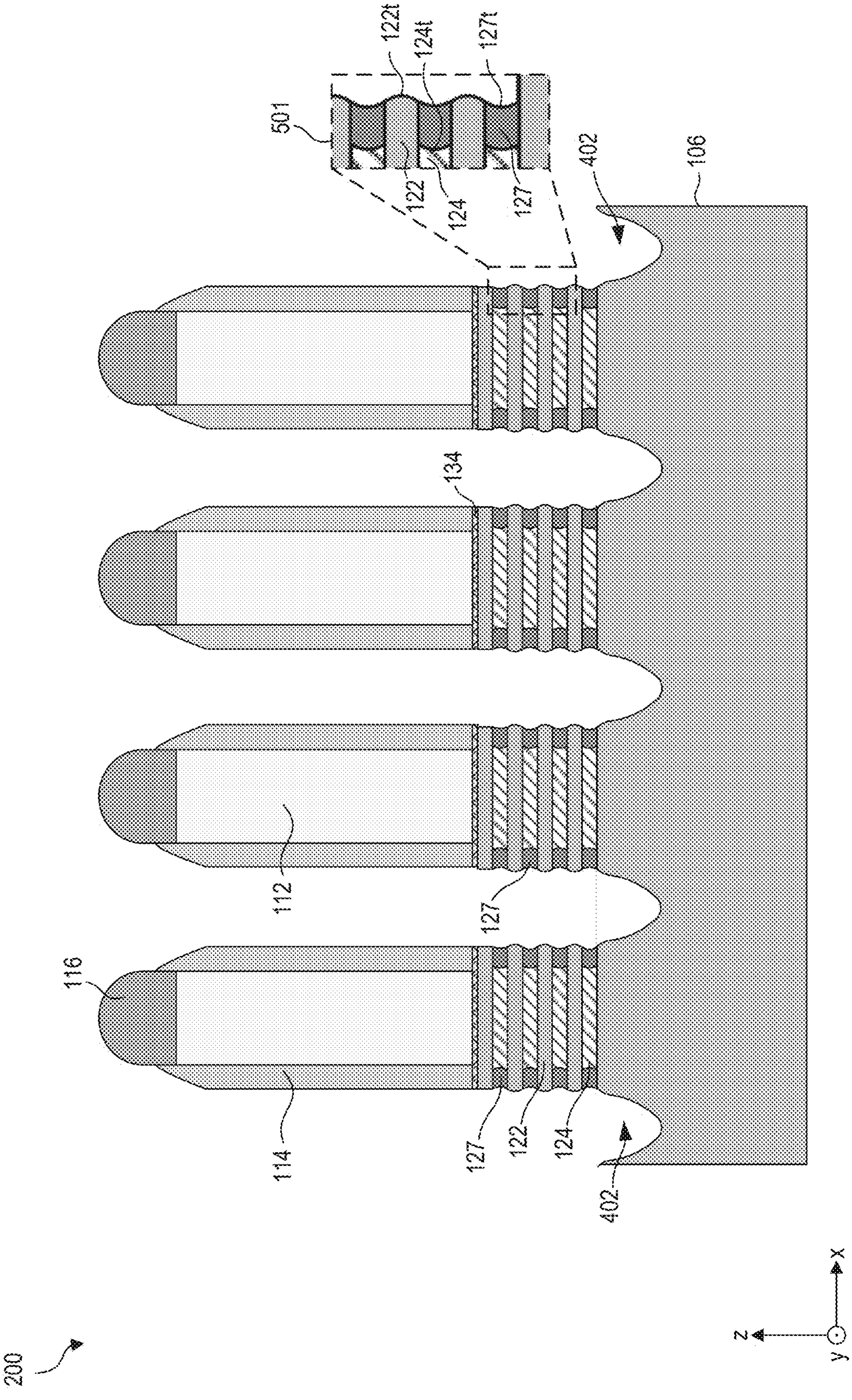

Referring to FIG. 1, in operation 120, inner spacer structures are formed between the semiconductor layers, according to some embodiments. Referring to FIG. 5, portions of semiconductor layers 124 can be etched back to form recessed regions and dielectric material can be deposited in the recessed regions to form inner spacers 127. For example, semiconductor device 200 shown in FIG. 5 can include n-type metal-oxide-semiconductor (NMOS) devices and portions of semiconductor layers 124 are etched back. In some embodiments, an inner spacer of inner spacers 127 is formed between a pair of adjacent semiconductor layers 122. In some embodiments, a bottom-most inner spacer of inner spacers 127 can be formed between semiconductor layer 122 and substrate 106.

Semiconductor device 200 can also include p-type metal-oxide-semiconductor (PMOS) devices. PMOS device configurations are not shown in FIG. 5 for simplicity. For the PMOS device configurations, semiconductor layers 124 can be processed to be used as the channel regions. Semiconductor layers 122 can be etched back using suitable etching processes and inner spacers 127 can be formed between adjacent semiconductor layers 124 using similar deposition and etching processes described below.

Semiconductor layers 124 can be etched back by a dry etching process, a wet etching process, or a combination thereof. The etch back process of semiconductor layers 124 can be configured to form non-planar outer surfaces of semiconductor layers 122 and 124. For example, the etching process can include alternating cycles of etching and purging processes. The etching process in each cycle can include using a gas mixture having hydrogen fluoride (HF), nitrogen trifluoride ($NF_3$), a fluorine-based gas, and a chlorine-based gas. As shown in enlarged view 501 of FIG. 5, semiconductor layers 122 can have curved convex outer surfaces **122*t* and semiconductor layers 124 can have curved concave outer surfaces 124*t*. In some embodiments, subsequently-formed inner spacers 127 can also have outer surfaces 127*t* that substantially contour outer surface 124*t* of semiconductor layers 124. The non-planar (e.g., curved) outer surfaces of inner spacers 127 and semiconductor layers 122** can reduce voids in subsequently-formed source/drain structures by removing sharp corners where voids tend to form.

The process of forming recess regions can be followed by a blanket deposition of a dielectric material layer and a horizontal etch of the blanket-deposited dielectric material layer to form inner spacers 127 on the concave outer surface **124*t* of semiconductor layers 124 and on top/bottom surfaces of semiconductor layers 122. In some embodiments, the blanket deposition process can include multiple cycles of deposition and etch processes. In each cycle, the etch process can follow the deposition process to prevent the formation of voids within inner spacers 127. Inner spacers 127 can include a single layer or a stack of dielectric layers, deposited by ALD, FCVD, or any other suitable deposition process. The etch process in each cycle of the blanket deposition process of dielectric material layer can include a dry etch process using a gas mixture of HF and $NH_3$. Inner spacer structures 127 can include a suitable dielectric material, such as silicon, oxygen, carbon, or nitrogen. The horizontal etch process of the blanket deposited dielectric material layer to form inner spacers 127 can be performed by a dry etch process using a gas mixture of HF and $NH_3$. Other methods of deposition and horizontal etch processes for forming inner spacer structures 127** can be used.

Figure 6:
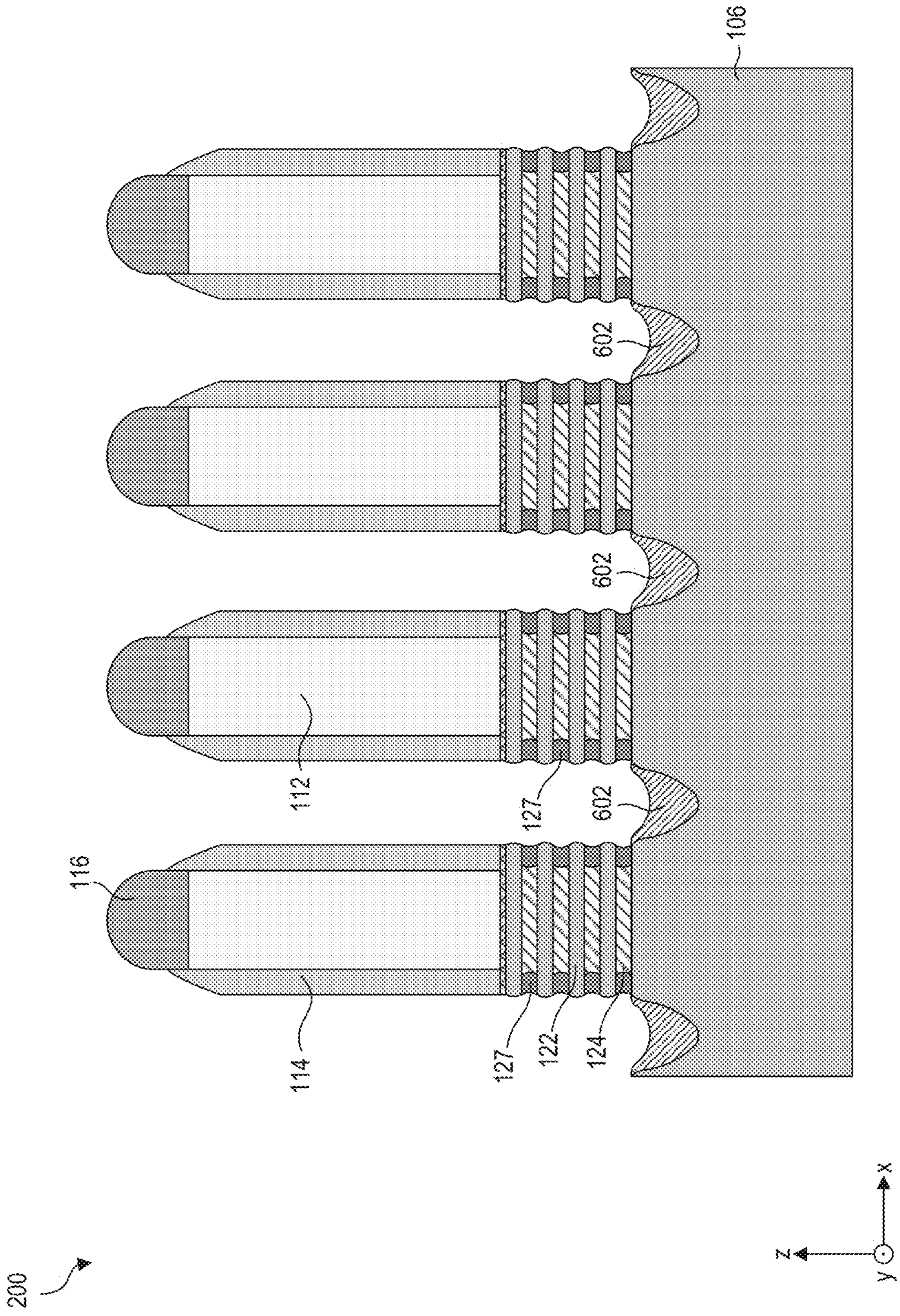

Referring to FIG. 1, in operation 125, first epitaxial structures can be formed in the recesses and on the exposed surfaces of the substrate, according to some embodiments. Referring to FIG. 6, first epitaxial structures 602 can be formed in recesses 402 illustrated in FIG. 5. In other words, first epitaxial structure 602 can be embedded in substrate 106. In some embodiments, first epitaxial structure 602 can be formed by a selective growth process where a semiconductor material is grown on selective surfaces. For example, first epitaxial structure 602 can be formed by epitaxially growing a crystalline material using exposed portions of substrate 106 as seed layers. In some embodiments, substrate 106 is formed of crystalline silicon, and an epitaxial deposition method using self-assembly monolayer (SAM) or selective-area ALD can be used to selectively grow crystalline silicon on exposed surfaces of substrate 106. First epitaxial structure 602 can be formed of silicon, silicon germanium, silicon phosphide, any suitable semiconductor material, and/or combinations of the same. In some embodiments, first epitaxial structure 602 can be doped with suitable dopants. For example, first epitaxial structure 602 can be doped with n-type dopants, such as phosphorous. In some embodiments, first epitaxial structure 602 can be doped with phosphorous or arsenic to an atomic concentration between about $0.5\times10^{20}$ at/$cm^3$ and about $8\times10^{20}$ at/$cm^3$, between about $0.7\times10^{20}$ at/$cm^3$ and about $6\times10^{20}$ at/$cm^3$, between about $1\times10^{20}$ at/$cm^3$ and about $5\times10^{20}$ at/$cm^3$, or any other suitable range. In some embodiments, first epitaxial structure 602 can be doped with p-type dopants, such as boron. For example, first epitaxial structure 602 can be doped with boron to an atomic concentration between about $0.5\times10^{20}$ at/$cm^3$ and about $8\times10^{20}$ at/$cm^3$, between about $0.7\times10^{20}$ at/$cm^3$ and about $6\times10^{20}$ at/$cm^3$, between about $1\times10^{20}$ at/$cm^3$ and about $5\times10^{20}$ at/$cm^3$, or any other suitable range.

In some embodiments, the implantation process for first epitaxial structure 602 can be performed using an ion implantation apparatus. During the implantation process, spacers 114 and hard mask layers 116 can act as masking layers to protect underlying semiconductor layers 122 and 124 from damage or contamination. In some embodiments, the ion implanting energy is tuned such that the dopant can be substantially implanted in first epitaxial structure 602. In some embodiments, the ions can be applied in a substantially vertical (e.g., z-direction). As a result, dopant concentration in first epitaxial structure 602 that is formed in recesses 402 can have a non-uniform dopant concentration.

Figure 7:
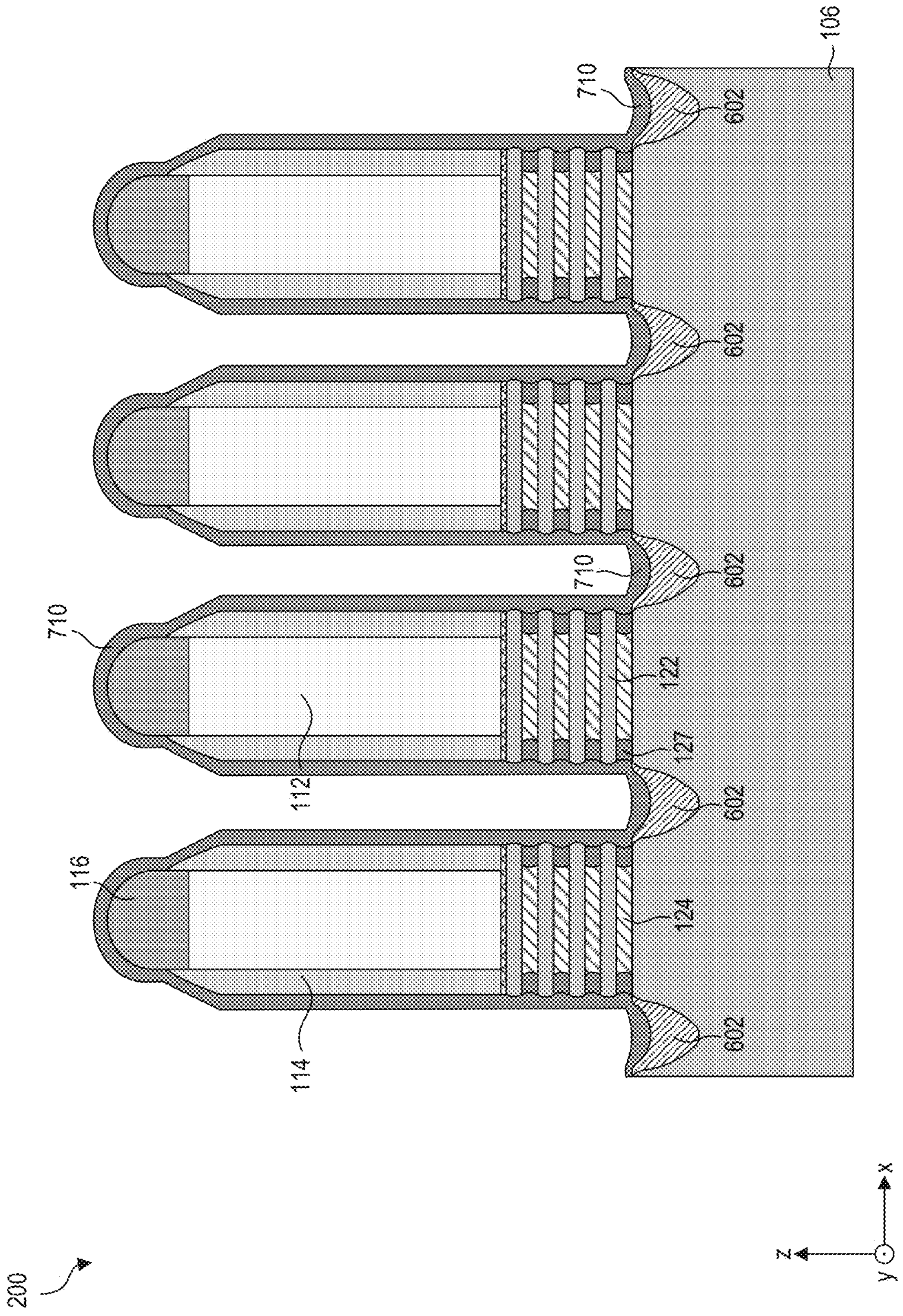

Referring to FIG. 1, in operation 130, a silicon-based layer is disposed on the first epitaxial structure, according to some embodiments. Referring to FIG. 7, a silicon-based layer 710 can be disposed on first epitaxial structure 602. In some embodiments, silicon-based layer 710 can also be disposed on exposed surfaces of inner spacer 127, semiconductor layers 122, spacers 114, and hard mask layers 116. In some embodiments, silicon-based layer 710 can have a substantially uniform thickness and continuously formed on the aforementioned surfaces. In some embodiments, silicon-based layer 710 can be formed using ALD. In some embodiments, silicon-based layer 710 can also be formed using CVD, PECVD, PVD, and the like. In some embodiments, silicon-based layer 710 can be epitaxially grown. For example, silicon-based layer 710 can be single crystalline silicon that is epitaxially grown from first epitaxial structure 602. In some embodiments, silicon-based layer 710 can be formed of polycrystalline silicon, crystalline silicon germanium, crystalline silicon germanium doped with boron (SiGe:B), crystalline silicon doped with phosphorous (Si:P), amorphous silicon, silicon oxide, silicon nitride, silicon oxycarbide doped with hydrogen (SiOC:H or SICO:H) silicon nitride carbide doped with hydrogen (SiCN:H or SiNC:H), silicon nitride carbide oxide doped with hydrogen (SiONC:H or SiOCN:H), any suitable silicon-based material, or combinations thereof.

Figure 8:
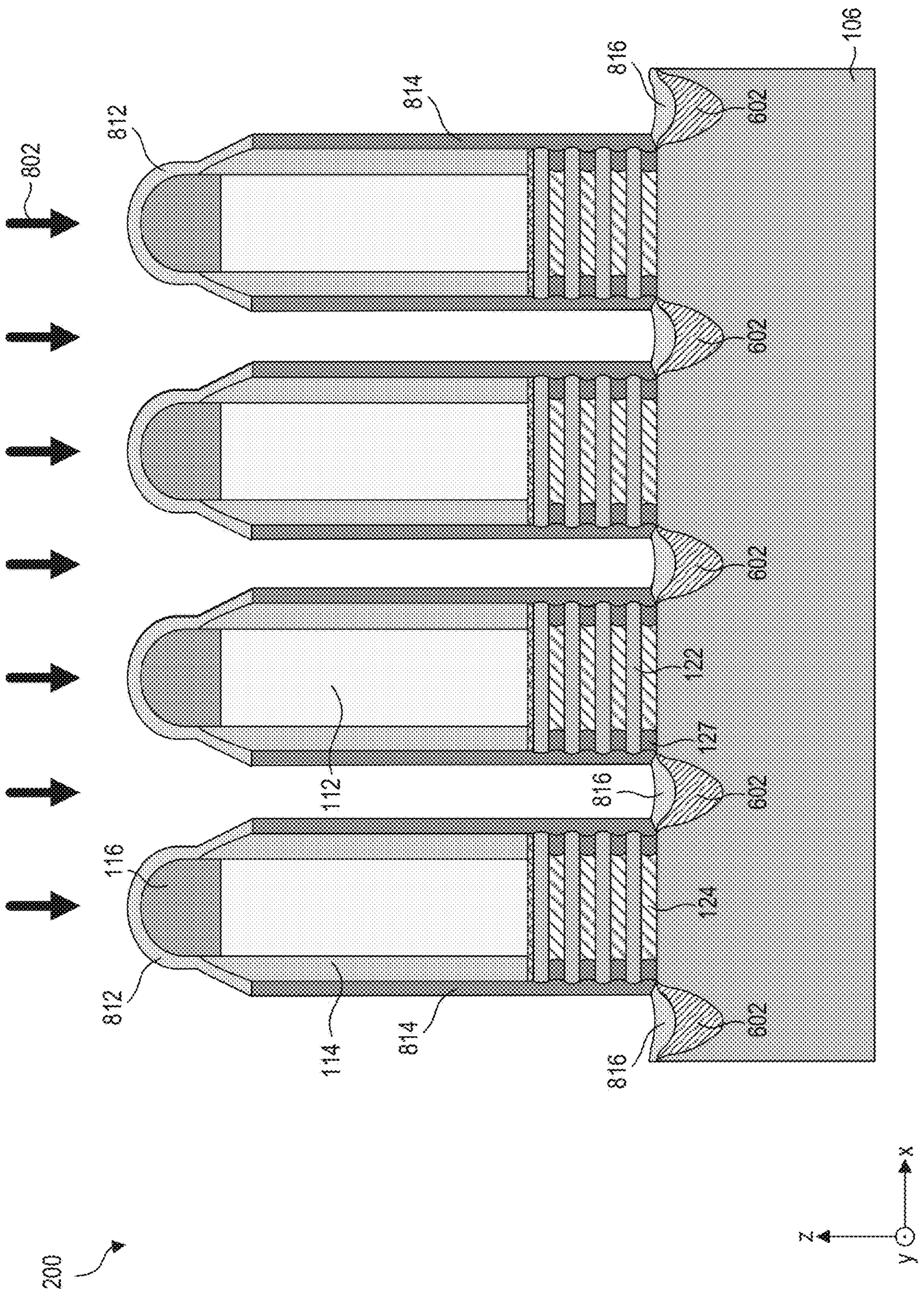

Referring to FIG. 1, in operation 135, a substantially vertical plasma-activated nitridation process can be performed on the silicon-based layer, according to some embodiments. Referring to FIG. 8, a plasma nitridation process 802 can be applied to exposed structures of semiconductor device 200, including exposed surfaces of silicon-based layer 710. Plasma nitridation process 802 can be performed in a substantially vertical manner (e.g., along the z direction) by applying a radio frequency (RF) bias to a structure of semiconductor device 200, such as substrate 106. In some embodiments, the RF bias applied to semiconductor device 200 can have a bias power that is between about 30 W and about 150 W. For example, the bias power can be between about 40 W and about 140 W, between about 50 W and about 130 W, between about 60 W and about 120 W, or any suitable power level. In some embodiments, applying a bias power less than about 30 W can lead to insufficient nitridation thickness. In some embodiments, applying a bias power greater than about 150 W may result in plasma-induced damage to underlying materials. 390° C. and about 410° C., or any suitable temperature level. In some embodiments, performing the nitridation process in a higher temperature can provide the benefit of higher nitridation rate and lower plasma-induced damage, and may also lead to lower wet etching rate of the nitridized portions. In some embodiments, plasma nitridation process 802 can also utilize any suitable carrier gas, such as one or more inert gases. For example, inert gases, such as argon and helium, can be used. In some embodiments, nitridation process 802 utilizing helium as the inert gas can provide the benefit of lower bombardment damage compared to nitridation processes using argon as the inert gas.

Figure 9:
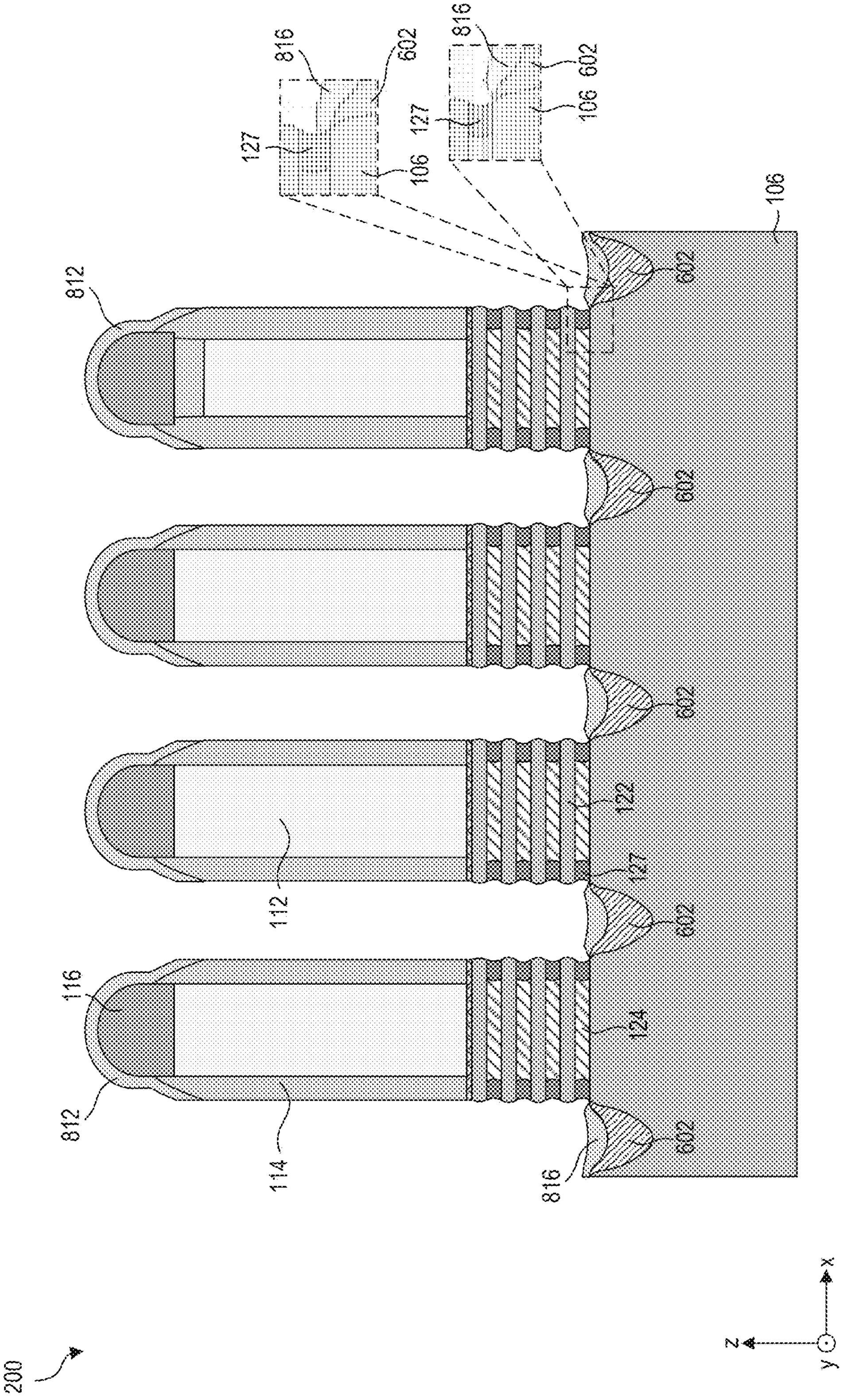

Referring to FIG. 1, in operation 140, un-nitridized portions of the silicon-based layer are removed, according to some embodiments. Referring to FIG. 9, un-nitridized portions such as vertical portions 814 are removed. In some embodiments, one or more wet etching processes or dry plasma etching processes can be performed to selectively remove vertical portions 814 while keeping nitridized layers 812 and 816 substantially intact. For example, one or more wet etching process for removing silicon or silicon oxide can be used. In some embodiments, the one or more wet etching processes can include a potassium hydroxide (KOH) wet etching process for removing silicon materials or include a buffered hydrofluoric acid (BHF) wet etching process for removing silicon oxide materials.

Figure 10:
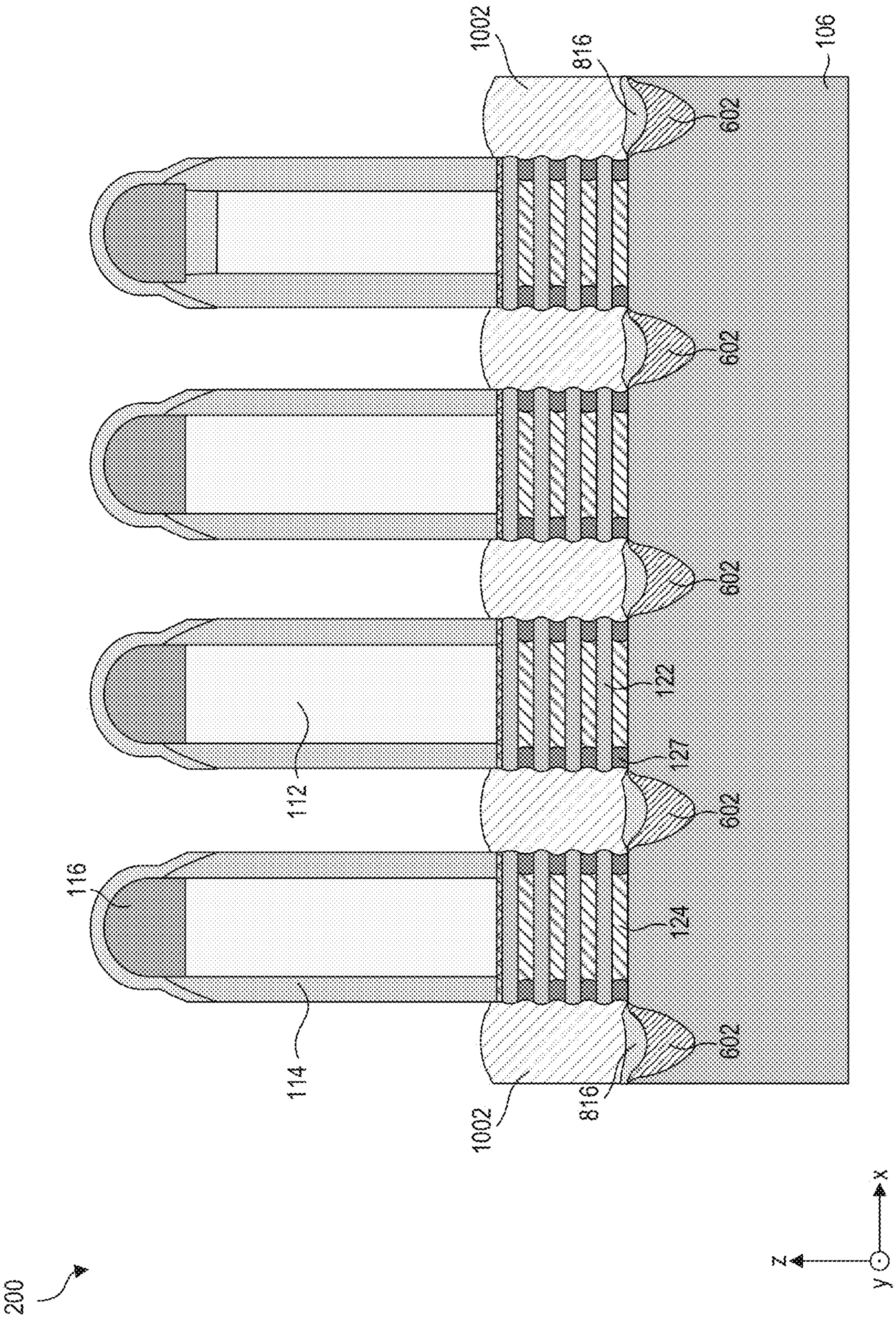

Referring to FIG. 1, in operation 145, second epitaxial structures are formed on the nitridized portions of the silicon-based layers, according to some embodiments. Referring to FIG. 10, second epitaxial structures 1002 are disposed on nitridized layers 816 that are formed on first epitaxial structures 602. Second epitaxial structure 1002 can be epitaxial structures deposited between adjacent polysilicon gate structures 112 and also on exposed side surfaces of inner spacers 127 and semiconductor layers 122. First epitaxial structure 602, nitridized layer 816, and second epitaxial structure 1002 can form the bulk of source/drain regions of semiconductor device 200. In some embodiments, second epitaxial structure 1002 can be epitaxially grown using nitridized layers 816 as seed layers. In some embodiments, second epitaxial structure 1002 can be formed using similar material as the material of nitridized layers 816, such as silicon nitride, silicon oxynitride, silicon oxycarbide nitride, or any suitable material. In some embodiments, second epitaxial structure 1002 includes a different material from the material of nitridized layer 816. In some embodiments, second epitaxial structure 1002 can be formed of silicon germanium, silicon phosphide, silicon arsenide, any suitable material, or combinations thereof. In some embodiments, second epitaxial structure 1002 can be grown by depositions processes similar to that of first epitaxial structure 602. In some embodiments, the deposition processes can be different. For example, second epitaxial structure 1002 can be formed using a plasma deposition process with an in-situ implantation process, and the dopant concentration in second epitaxial structure 1002 can be greater than the dopant concentration of first epitaxial structure 602. In some embodiments, an implantation process can be performed during or after the deposition process of second epitaxial structure 1002. During the implantation process, spacers 114, hard mask layers 116, and inner spacers 127 can act as masking layers to protect underlying semiconductor layers 122 and semiconductor layers 124 from damage or contamination.

Figure 11:
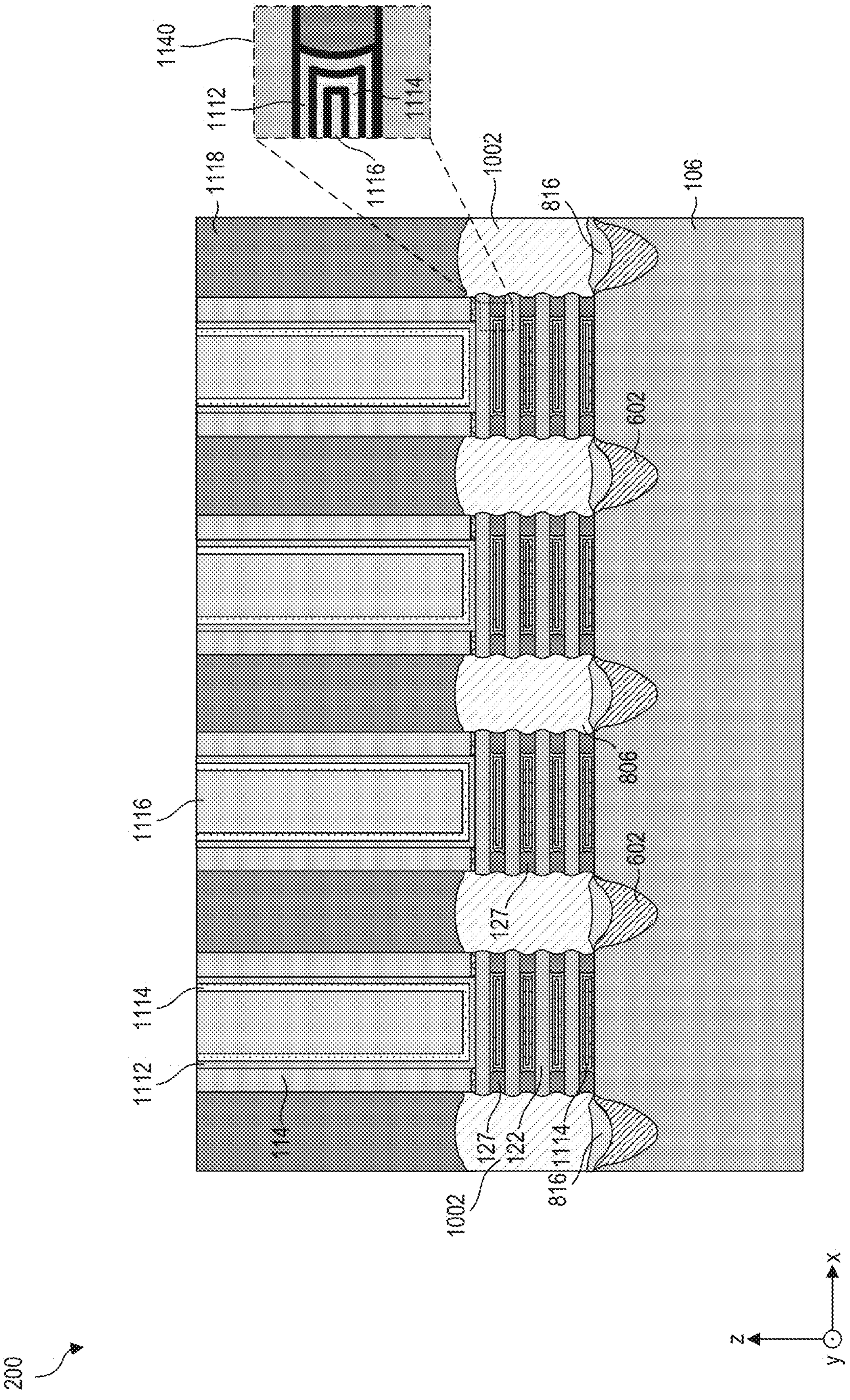

Referring to FIG. 1, in operation 150, an interlayer dielectric (ILD) layer is deposited and a replacement gate process is performed, according to some embodiments. Referring to FIG. 11, an ILD layer 1118 is deposited between spacers 114 and polysilicon gate structures are replaced by metal gate structures.

ILD layer 1118 can be disposed on second epitaxial structure 1002 of the source/drain regions and between spacers 114. ILD layer 1118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. Other materials and formation methods for ILD layer 1118 are within the scope and spirit of this disclosure.

The formation of ILD layer 1118 can be followed by a replacement gate process during which the polysilicon gate structures are replaced by a metal gate structure. For example, the replacement gate process can include removing polysilicon gate structures 112 and semiconductor layers 124 using a dry etching process (e.g., reaction ion etching) or a wet etching process, exposing portions of semiconductor layers 122, and forming metal gate structures around semiconductor layers 122. The exposed semiconductor layers 122 can be referred to as "nanostructures" (e.g., nanowires or nanosheets). In some embodiments, the gas etchants used in the dry etching process can include chlorine, fluorine, bromine, or a combination thereof. In some embodiments, an ammonium hydroxide ($NH_4OH$), sodium hydroxide (NaOH), and/or KOH wet etch can be used to remove polysilicon gate structures 112 and semiconductor layer 124, or a dry etch followed by a wet etch process can be used.

Gate dielectric layers 1112 can be formed on the semiconductor layers. As shown in FIG. 11, gate dielectric layers 1112 can be wrapped around on exposed nanowire-shaped second semiconductor layers 122. Forming gate dielectric layers 1112 can include a blanket deposition process of a suitable gate dielectric material layer. In some embodiments, gate dielectric layers 1112 can be formed of a high-k dielectric material (e.g., dielectric material having dielectric constant greater than about 3.9). For example, gate dielectric layers 1112 can be formed of hafnium oxide. Work function layers 1114 are formed on gate dielectric layers 1112. In some embodiments, each work function layer 1114 can include one or more work function metal layers and formed using the same or different material and/or thickness. Gate dielectric layers 1112 and gate work function layers 1114 can each wrap around nanowire-shaped semiconductor layers 122. Depending on the spaces between adjacent semiconductor layers 122, semiconductor layers 122 can be wrapped around by gate dielectric layer 1112 and work function layers 1114, filling the spaces between adjacent semiconductor layers 122. In some embodiments, subsequently-formed gate electrode material can also be formed in the spaces between adjacent semiconductor layers 122, as described below.

Gate electrodes 1116 can be formed on the work function layers, according to some embodiments. Layers of conductive material for gate electrodes 1116 are formed on work function layers 1114. As shown in enlarged view 1140, if separations between adjacent semiconductor layers 122 are sufficient to accommodate the thickness of the gate electrode material, gate electrodes 1116 can be formed between adjacent semiconductor layers 122 and on work function layers 1114 such that the spaces between adjacent semiconductor layers 122 are filled. Gate electrodes 1116 that are between adjacent semiconductor layers 122 and gate electrodes 1116 that are formed between spacers 114 are electrically coupled to each other. The layer of conductive material for gate electrodes 1116 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and combinations thereof. Gate electrodes 1116 can be formed by ALD, PVD, CVD, or any other suitable deposition process. The deposition of gate electrodes 1116 can continue until openings between opposing spacers 114 are filled with gate electrodes 1116. A chemical mechanical polishing process can remove excessive gate electrodes 1116 such that top surfaces of gate electrodes 1116 and ILD layer 1118 are substantially coplanar. In some embodiments, other structures can be formed, such as blocking layers. One or more blocking layers (not shown in FIG. 11) can be formed prior to depositing gate electrodes 1116 to prevent diffusion and oxidation of gate electrodes 1116. In some embodiments, a CMP process can be performed after the deposition of ILD layer 1118 and prior to the formation of metal gate structures including gate dielectric layers 1112, work function layers 1114, and gate electrodes 1116. In some embodiments, the CMP process can be performed after the metal gate structures are formed, such that top surfaces of gate dielectric layers 1112, work function layers 1114, gate electrodes 1116, and ILD layer 1118 are substantially coplanar (e.g., level).

Figure 12:
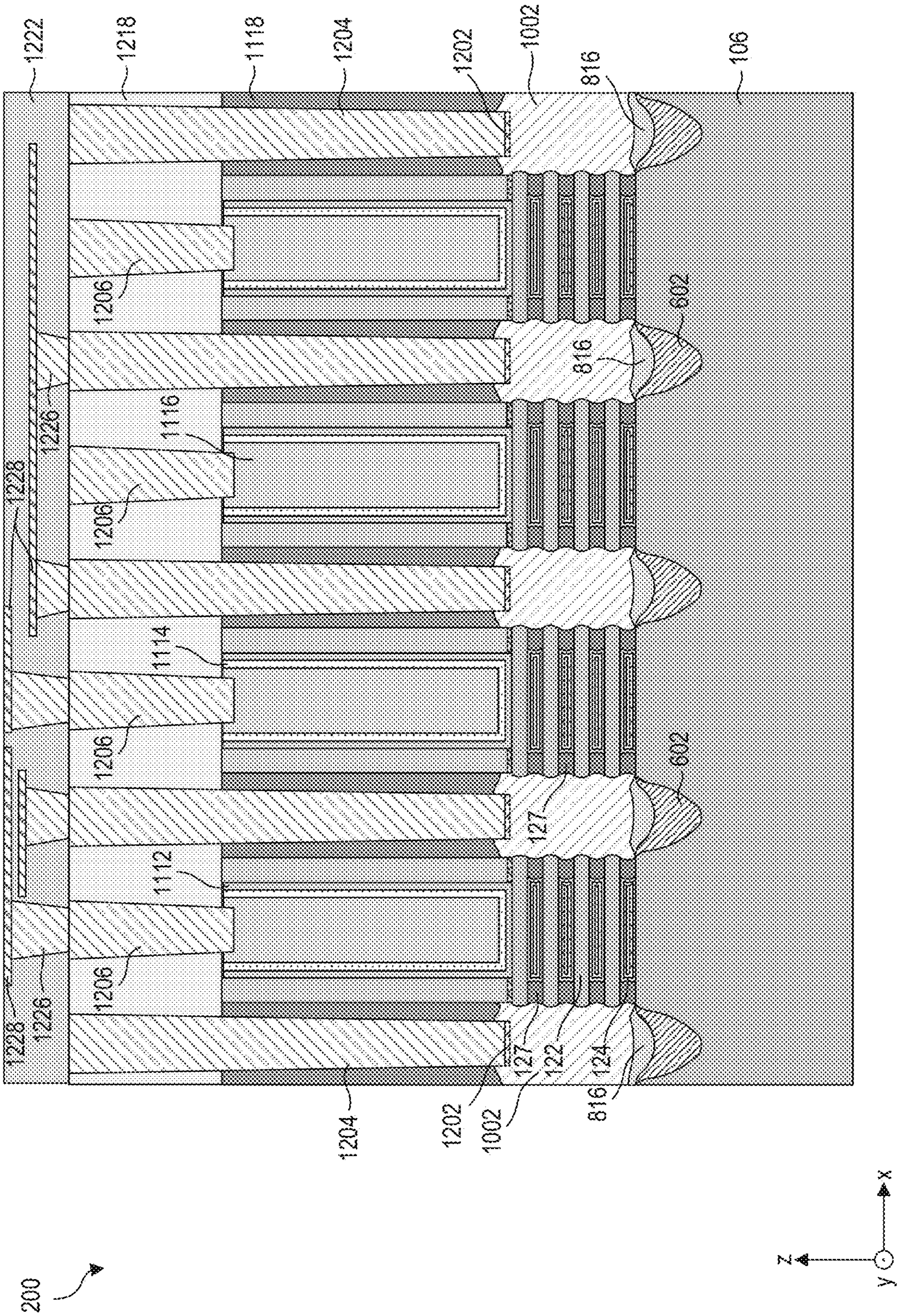

Referring to FIG. 1, in operation 155, source/drain contacts and gate contacts are formed, according to some embodiments. Referring to FIG. 12, source/drain contacts 1204 and gate contacts 1206 are formed to provide electrical connections to the source/drain regions and the gate electrodes, respectively. Specifically, source/drain contacts 1204 and gate contacts 1206 can be used to transmit electrical signals between source/drain regions and gate electrodes and external terminals (not shown in FIG. 12). For example, gate contacts 1206 can be electrically coupled to gate electrodes 1116 formed between spacers 114 and between adjacent semiconductor layers 122. Additional ILD layers can be formed on the top surface ILD layer 1118. For example, dielectric layer 1218 can be formed on ILD layer 1118. In some embodiments, dielectric layer 1218 can be formed using similar material as ILD layer 1118. Gate contacts 1206 and source/drain contacts 1204 can be formed by forming openings in dielectric layer 1218, gate electrodes 1116, and ILD layer 1118, and depositing a conductive material in the openings. The deposition process can include depositing a metal layer within the openings and performing an anneal process to induce silicidation of the deposited metal layer. The conductive materials for forming source/drain contacts 1204 and gate contacts 1206 can include titanium, aluminum, silver, tungsten, cobalt, copper, ruthenium, zirconium, nickel, titanium nitride, tungsten nitride, metal alloys, or combinations thereof. The deposition process can include ALD, PVD, CVD, any suitable deposition processes, or combinations thereof. Gate contacts 1206 and source/drain contacts 1204 can be connected to gate electrodes 1116 and second epitaxial structure 1002 of the source/drain region, respectively.

A planarization process (e.g., CMP processes) can planarize the top surfaces of dielectric layer 1218, source/drain contacts 1204, and gate contacts 1206 such that the top surfaces of aforementioned structures are substantially coplanar. In some embodiments, gate contacts 1206 can extend into gate electrodes 1116. In some embodiments, source/drain contacts 1204 can extend into second epitaxial structure 1002 of the source/drain regions. Silicide regions 1202 can be formed between source/drain contacts 1204 and second epitaxial structure 1002 of the source/drain regions to reduce contact resistance. In some embodiments, silicide regions 1202 can include ruthenium silicide, nickel silicide, cobalt silicide, tungsten silicide, tantalum silicide, platinum silicide, erbium silicide, palladium silicide, any suitable silicide material, or combinations thereof.

Back-end-of-line (BEOL) interconnect structures are formed over source/drain contacts 1204 and gate contacts 1206. BEOL interconnect structures can be formed in dielectric layers 1222 deposited on dielectric layer 1218. Interconnects can be formed in dielectric layer 1222. In some embodiments, the interconnects can be a network of electrical connections that include vias 1226 extending vertically (e.g., along the z-axis) and wires 1228 extending laterally (e.g., along the x-axis). Interconnect structures can provide electrical connections to source/drain contacts 1204 and gate contacts 1206. In some embodiments, suitable passive and active semiconductor devices can be formed in dielectric layers 1218 and 1222 and are not illustrated for simplicity.

Figure 13:
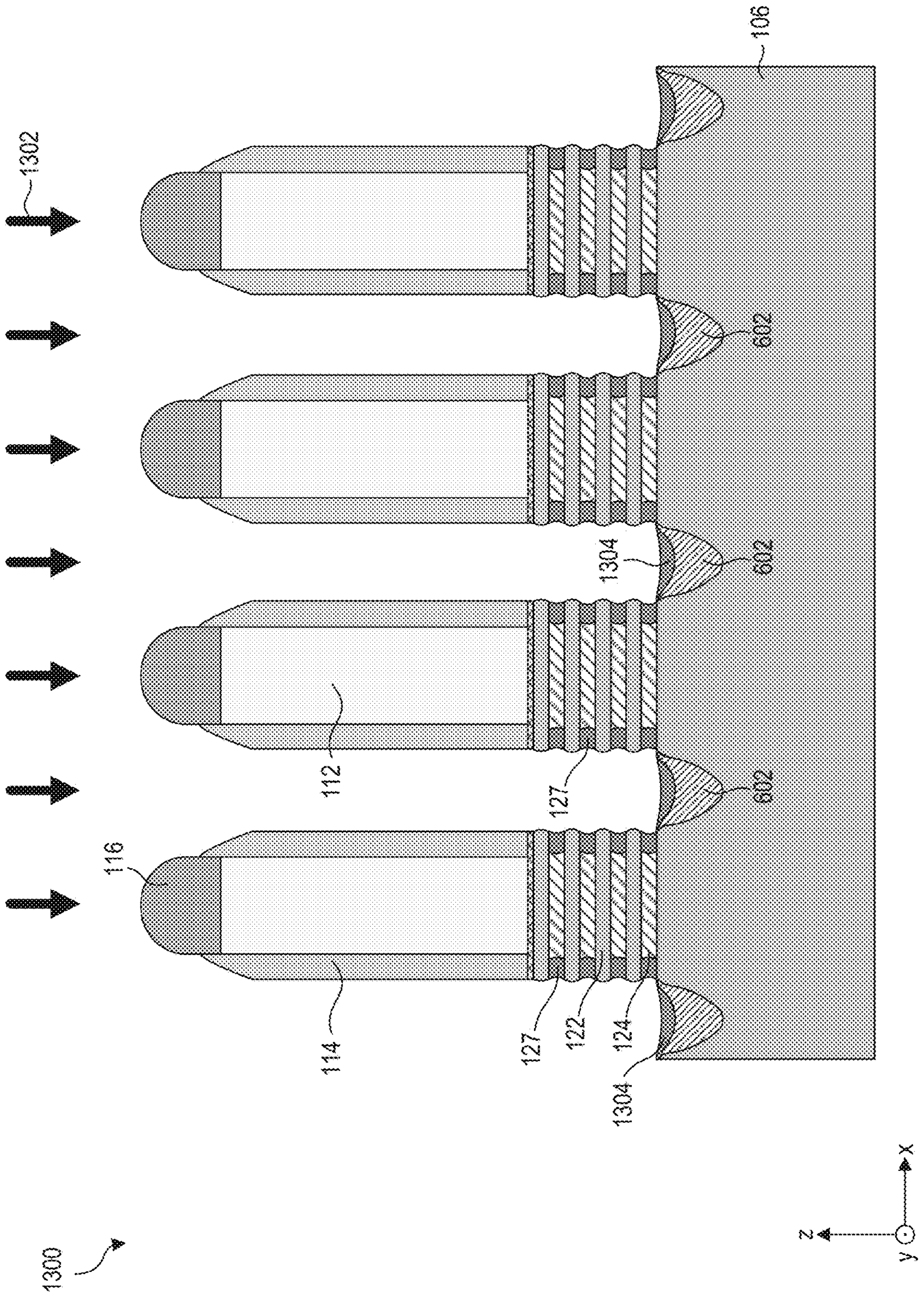
FIGS. 13 and 14 illustrate various cross-sectional views of semiconductor devices for fabricating multi-layer epitaxial source/drain structures with treatment processes, in accordance with some embodiments.
Figure 14:
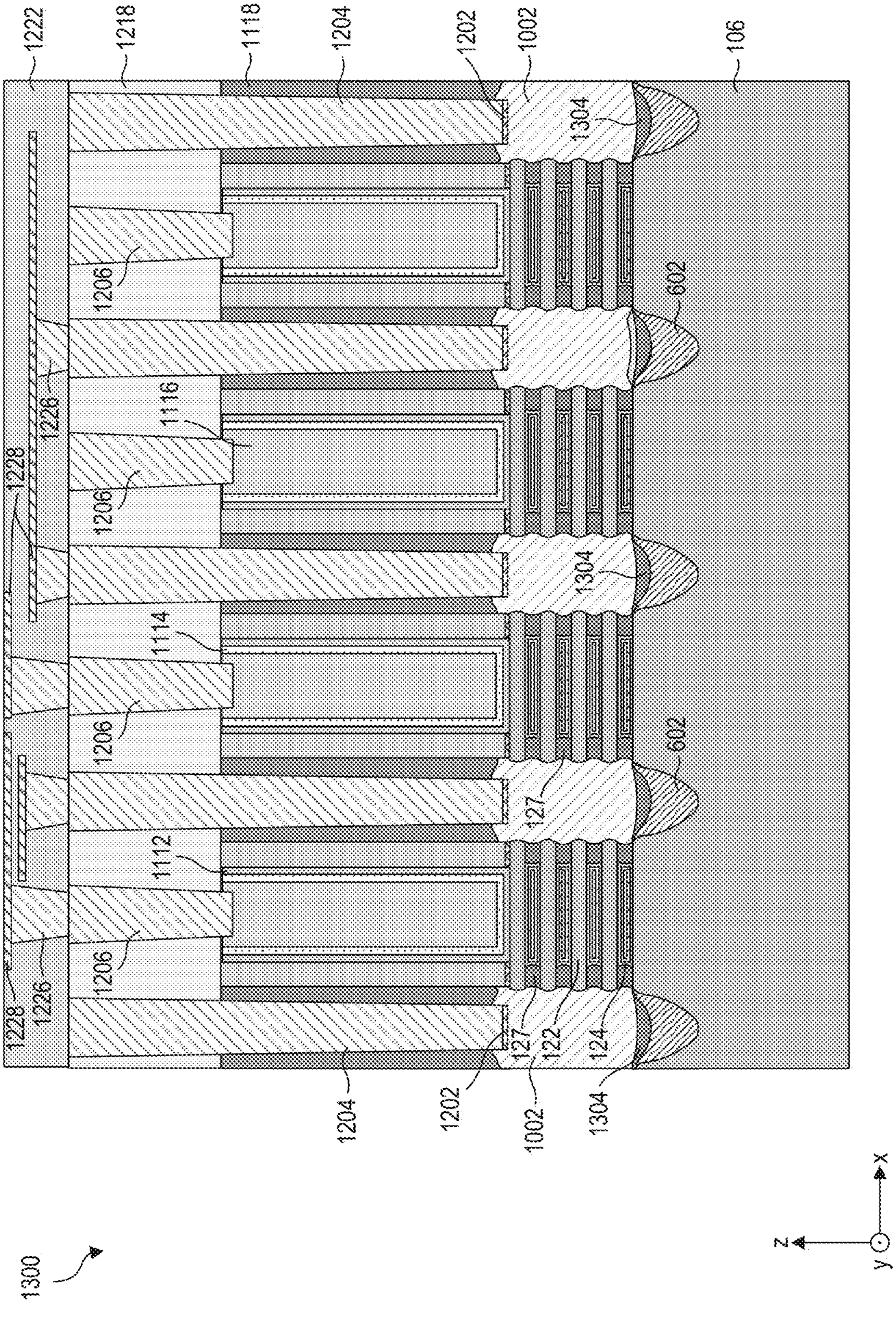

FIGS. 13 and 14 illustrate a fabrication process of multilayer epitaxial structures for semiconductor devices using treatment processes, according to some embodiments. Elements in FIGS. 13 and 14 with the same numeral labels as those in FIG. 12 are directed to similar structure and/or materials and are not repeated for simplicity.

Referring to FIG. 13, a treatment process 1302 can be performed directly on first epitaxial structure 602 of semiconductor structure 1300 to convert portions of first epitaxial structure 602 into nitridized portions 1304. Epitaxial structure 602 illustrated in FIG. 13 can be similar to epitaxial structure 602 described in FIGS. 6-12. In some embodiments, treatment process 1302 can be a plasma nitridation process similar to plasma nitridation process 802. In some embodiments, treatment process 1302 can use different processing parameters as nitridation process 802. In some embodiments, first epitaxial structure 602 can be formed using crystalline silicon and treatment process 1302 can be used to form crystalline silicon nitride material by converting a top portion of first epitaxial structure 602. In some embodiments, similar to plasma nitridation process 802, treatment process 1302 can be a plasma process in a substantially vertical direction by applying suitable potential bias to substrate 106.

FIG. 14 illustrates various contacts and interconnect structures being formed in semiconductor structure 1300, according to some embodiments. For example, source/drain contacts 1204 can be formed extending through ILD layer 1118 and in contact with second epitaxial structure 1002. In some embodiments, silicide region 1202 can be formed between source/drain contacts 1204 and second epitaxial structure 1002 to reduce contact resistance.

Various embodiments in the present disclosure describe methods for forming epitaxial source/drain structures. For example, a multi-operation epitaxial source/drain formation process can be used in forming source/drain structures for GAAFETs. For example, a silicon-based film can be deposited on a first epitaxial structure followed by a nitridation treatment process on the silicon-based film. A second epitaxial structure can be formed on the treated silicon-based film. The first epitaxial structure, the treated silicon-based film, and the second epitaxial structure can form a multilayer epitaxial source/drain structure. The multi-operation epitaxial source/drain formation process can include forming a nitride layer on an epitaxial seed structure in order to facilitate epitaxial growth of the source/drain structure. Additional epitaxial materials are formed on the nitride layer until the bulk of source/drain structures are formed. The nitridation process described in the present disclosure can include a high-bias potential in-situ or ex-situ plasma nitridation process without plasma-induced damage to underlying structures. The multi-operation epitaxial source/drain structures described herein provide various benefits that can improve device performance, reliability, and yield.

In some embodiments, a semiconductor device includes nanostructures on a substrate and a source/drain region in contact with the nanostructures. The source/drain region includes (i) a first epitaxial structure embedded in the substrate; (ii) a nitride layer on the first epitaxial structure; and a second epitaxial structure on the first epitaxial structure. The semiconductor device also includes a gate structure formed on the nanostructures.

In some embodiments, a semiconductor device includes nanostructures and a gate dielectric layer around a nanostructure of the nanostructures. The semiconductor device also includes a gate electrode disposed on the gate dielectric layer and on the nanostructures. The semiconductor device further includes a source/drain region in contact with the nanostructures. The source/drain region includes (i) a first epitaxial structure embedded in the substrate; (ii) a nitride layer on the first epitaxial structure; and (iii) a second epitaxial structure on the first epitaxial structure.

In some embodiments, a method includes forming nanostructures on a substrate and forming spacers. Each spacer is formed between a pair of nanostructures. The method further includes etching the substrate to form a recess and depositing a first epitaxial structure in the recess. The method also includes forming a silicon-based layer on the first epitaxial structure, the nanostructures, and the spacers. The method further includes performing a nitridation process on a portion of the silicon-based layer that is deposited on the first epitaxial structure to form a nitride layer on the first epitaxial structure. The method also includes depositing a second epitaxial structure on the nitride layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- a plurality of nanostructures on a substrate comprising a bottommost nanostructure;
- a gate structure on the plurality of nanostructures and comprising a bottom layer directly beneath the bottommost nanostructure;
- a source/drain region in contact with the plurality of nanostructures, comprising:
  - a first epitaxial structure embedded in the substrate;
  - a nitride layer embedded in the substrate and on the first epitaxial structure, wherein:
    - a top surface of the nitride layer is disposed between a bottom surface of the bottom layer directly beneath the bottommost nanostructure and a top surface of the bottom layer directly beneath the bottommost nanostructure; and
  - a second epitaxial structure on the first epitaxial structure; and
- a gate structure formed on the plurality of nanostructures.

2. The semiconductor device of claim 1, wherein the nitride layer comprises silicon.

3. The semiconductor device of claim 1, wherein the first epitaxial structure and the second epitaxial structure are formed using different materials.

4. The semiconductor device of claim 1, further comprising a plurality of inner spacers, wherein an inner spacer of the plurality of inner spacers is formed between adjacent nanostructures of the plurality of nanostructures.

5. The semiconductor device of claim 4, wherein the nitride layer is in contact with an other inner spacer of the plurality of inner spacers, wherein the other inner spacer is formed between the substrate and a nanostructure of the plurality of nanostructures.

6. The semiconductor device of claim 1, further comprising a source/drain contact extending into the second epitaxial structure.

7. The semiconductor device of claim 6, further comprising a silicide layer between the source/drain contact and the second epitaxial structure.

8. The semiconductor device of claim 1, wherein the second epitaxial structure is in contact with the plurality of nanostructures.

9. A semiconductor device, comprising:
- a plurality of nanostructures comprising a bottommost nanostructure;
- a gate structure formed on the plurality of nanostructures and comprising a bottom layer directly beneath the bottommost nanostructure;
- a gate dielectric layer around a nanostructure of the plurality of nanostructures;
- a gate electrode disposed on the gate dielectric layer and on the plurality of nanostructures; and
- a source/drain region in contact with the plurality of nanostructures, comprising:
  - a first epitaxial structure embedded in a substrate;
  - a nitride layer embedded in the substrate and on the first epitaxial structure, wherein a top surface of the bottom layer directly beneath the nitride layer is disposed between a bottom surface of the bottom layer directly beneath the bottommost nanostructure and a top surface of the bottommost nanostructure; and
  - a second epitaxial structure on the first epitaxial structure.

10. The semiconductor device of claim 9, wherein the nitride layer comprises silicon.

11. The semiconductor device of claim 9, further comprising a plurality of inner spacers, wherein an inner spacer of the plurality of inner spacers is formed between adjacent nanostructures of the plurality of nanostructures.

12. The semiconductor device of claim 11, wherein the nitride layer is in contact with an other inner spacer of the plurality of inner spacers, wherein the other inner spacer is formed between the substrate and an other nanostructure of the plurality of nanostructures.

13. A semiconductor device, comprising:
- a plurality of nanostructures on a substrate comprising a bottommost nanostructure;
- a source/drain region in contact with the plurality of nanostructures, comprising:

a first epitaxial structure embedded in the substrate; and a nitride layer embedded in the substrate and on the first epitaxial structure, wherein a top surface of the nitride layer is disposed between a bottom surface of the bottommost nanostructure and a top surface of the bottommost nanostructure; and a gate structure formed on the plurality of nanostructures.

14. The semiconductor device of claim 13, wherein the nitride layer comprises silicon.

15. The semiconductor device of claim 13, further comprising a plurality of inner spacers, wherein an inner spacer of the plurality of inner spacers is formed between adjacent nanostructures of the plurality of nanostructures.

16. The semiconductor device of claim 15, wherein the plurality of inner spacers are alternately disposed on the plurality of nanostructures.

17. The semiconductor device of claim 1, wherein a portion of a bottommost surface of the nitride layer is disposed below a bottom surface of the bottom layer directly beneath the bottommost nanostructure.

18. The semiconductor device of claim 9, wherein a portion of a bottommost surface of the nitride layer is disposed below a bottom surface of the bottom layer directly beneath the bottommost nanostructure.

19. The semiconductor device of claim 13, wherein a portion of a bottommost surface of the nitride layer is disposed below a bottom surface of the bottom layer directly beneath the bottommost nanostructure.

20. The semiconductor device of claim 1, wherein the second epitaxial structure comprises germanium.

* * * * *